(12) United States Patent
Lee

(10) Patent No.: US 8,411,015 B2
(45) Date of Patent: Apr. 2, 2013

(54) OPERATIONAL AMPLIFIER, SOURCE DRIVER OF A DISPLAY, AND METHOD FOR CONTROLLING THE OPERATIONAL AMPLIFIER THEREOF

(75) Inventor: Ching-Chung Lee, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 1002 days.

(21) Appl. No.: 12/340,761

(22) Filed: Dec. 22, 2008

(65) Prior Publication Data

US 2010/0156855 A1    Jun. 24, 2010

(51) Int. Cl.
*G09G 3/30*     (2006.01)
(52) U.S. Cl. .................. 345/100; 345/204; 330/296
(58) Field of Classification Search .................. 345/100, 345/204
See application file for complete search history.

(56) References Cited

U.S. PATENT DOCUMENTS

| | | | | |
|---|---|---|---|---|
| 6,496,175 | B1 * | 12/2002 | Fukuo | 345/99 |
| 7,342,527 | B2 * | 3/2008 | Tsuchi | 341/144 |
| 7,525,383 | B2 * | 4/2009 | Kobayashi et al. | 330/261 |
| 7,903,078 | B2 * | 3/2011 | Tsuchi | 345/100 |
| 2008/0079492 | A1 | 4/2008 | Kobayashi | |
| 2008/0111628 | A1 | 5/2008 | Tsuchi | |

* cited by examiner

*Primary Examiner* — Alexander S Beck
*Assistant Examiner* — James M Holland
(74) *Attorney, Agent, or Firm* — Winston Hsu; Scott Margo

(57) ABSTRACT

An operational amplifier includes a first stage, a second stage, and a switching unit. The first stage receives an analog input signal. The second stage has an output node coupled to an output switch. The switching unit is coupled between the first stage and the second stage. The switching unit includes a capacitive component and a first switch coupled to the capacitive component in series. The first switch is turned off when the output switch is turned on. The first switch is turned off while the analog input signal is in transition, and is turned on while the analog input signal is steady. The first switch is turned on when the output switch is turned off.

17 Claims, 6 Drawing Sheets

OPERATIONAL AMPLIFIER, SOURCE DRIVER OF A DISPLAY, AND METHOD FOR CONTROLLING THE OPERATIONAL AMPLIFIER THEREOF

BACKGROUND OF THE INVENTION

1. Field of the Invention

The present invention relates to an operational amplifier, and more particularly, to an operational amplifier of a source driver and method thereof.

2. Description of the Prior Art

Liquid crystal display (LCD) devices are flat panel displays characterized by their thin appearance, low radiation and low power consumption. LCD devices have gradually replaced traditional cathode ray tube (CRT) displays, and have been widely applied in various electronic products such as notebook computers, personal digital assistants (PDAs), flat panel televisions, or mobile phones. An LCD device usually includes an LCD panel, a timing controller, a gate driver, and a source driver. The timing controller is used for generating image data signals, together with control signals and timing signals for driving the LCD panel. The gate driver is used for generating scan signals for turning the pixel circuits on and off, and the source driver is used for generating driving signals based on the image data signals, the control signals and the timing signals.

Normally, a driving capacity and a slew-rate of an operational amplifier of a source driver is related to its bias current $I_1$ and its compensation capacitor $C_C$. In other words, the slew-rate of the operational amplifier is limited by $I_1/C_C$. In order to improve the driving capacity and the slew-rate of the operational amplifier, the bias current $I_1$ needs to be increased or the compensation capacitor $C_C$ needs to be decreased or directly removed. If the compensation capacitor $C_C$ is directly removed, the operational amplifier becomes unstable in a high-impedance state. Therefore, the operational amplifier presently needs to be improved to solve the limited slew-rate issue and the instability issue without increasing the bias current $I_1$.

SUMMARY OF THE INVENTION

It is one of the objectives of the claimed invention to provide an operational amplifier and a related source driver and a method to solve the abovementioned problems.

According to one embodiment, an operational amplifier is provided. The operational amplifier includes a first stage, a second stage, and a switching unit. The first stage receives an analog input signal. The second stage has an output node coupled to an output switch. The switching unit is coupled between the first stage and the second stage. The switching unit includes a capacitive component and a first switch coupled to the capacitive component in series. The first switch is turned off when the output switch is turned on. The first switch is turned on when the output switch is turned off.

According to one embodiment, a source driver of a display is provided. The source driver includes a digital-to-analog converter, an output switch, and an operational amplifier. The digital-to-analog converter is used for converting a digital input signal into an analog input signal. The operational amplifier is coupled to the digital-to-analog converter for driving at least a data line of the display according to the analog input signal via the output switch. The operational amplifier includes a first stage, a second stage, and a switching unit. The first stage receives the analog input signal. The second stage has an output node coupled to an output switch. The switching unit is coupled between the first stage and the second stage. The switching unit includes a capacitive component and a first switch coupled to the capacitive component in series. The first switch is turned off when the output switch is turned on. The first switch is turned on when the output switch is turned off.

According to one embodiment, a method for controlling an operational amplifier is provided. The operational amplifier includes a first stage for receiving an analog input signal, a second stage having an output node, and a switching unit having a capacitive component and a first switch coupled to the capacitive component in series. The method includes the steps of connecting the switching unit between the first stage and the second stage; connecting the output node of the second stage to an output switch; and turning off the first switch when the output switch is turned on.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but not in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
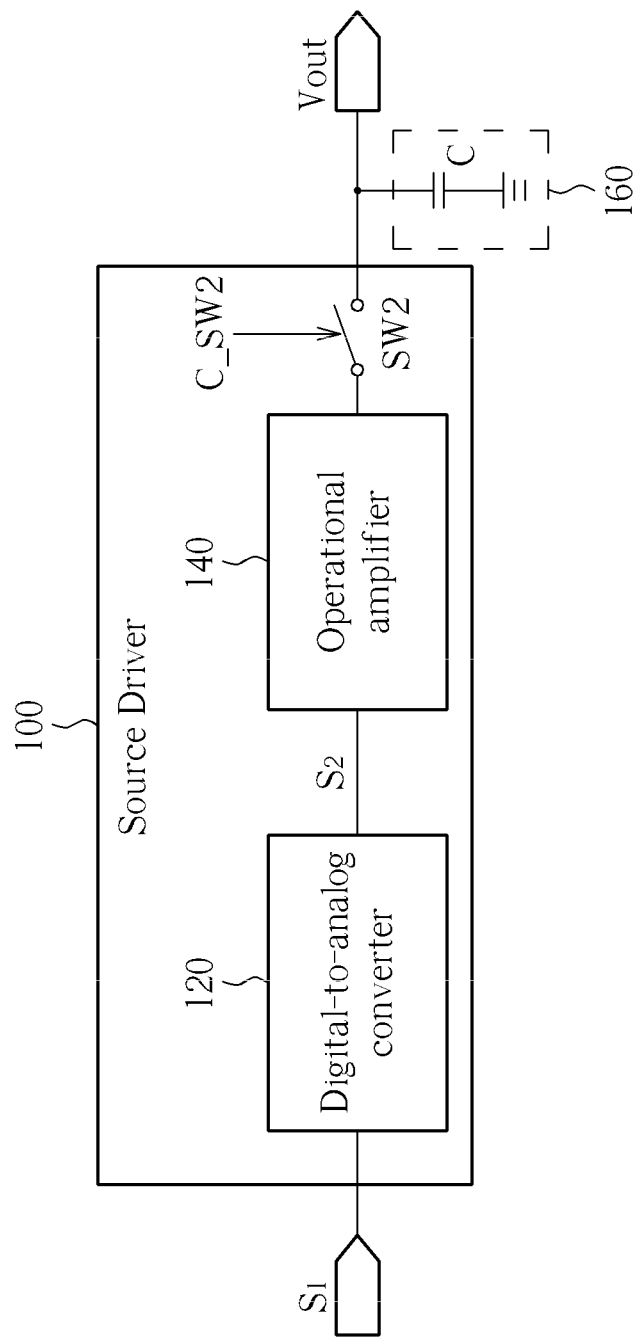
FIG. 1 is a block diagram of a source driver of a display.

FIG. 1 is a block diagram of a source driver 100 of a display. The source driver 100 includes, but is not limited to, a digital-to-analog converter 120, an output switch SW2, and an operational amplifier 140. The digital-to-analog converter 120 converts a digital input signal $S_1$ into an analog input signal $S_2$. The operational amplifier 140 is coupled to the digital-to-analog converter 120 for driving at least one data line of the display according to the analog input signal $S_2$ via the output switch SW2. The data line is emulated as an output load 160, which is a capacitor C, to be driven by the operational amplifier 140.

Figure 2:
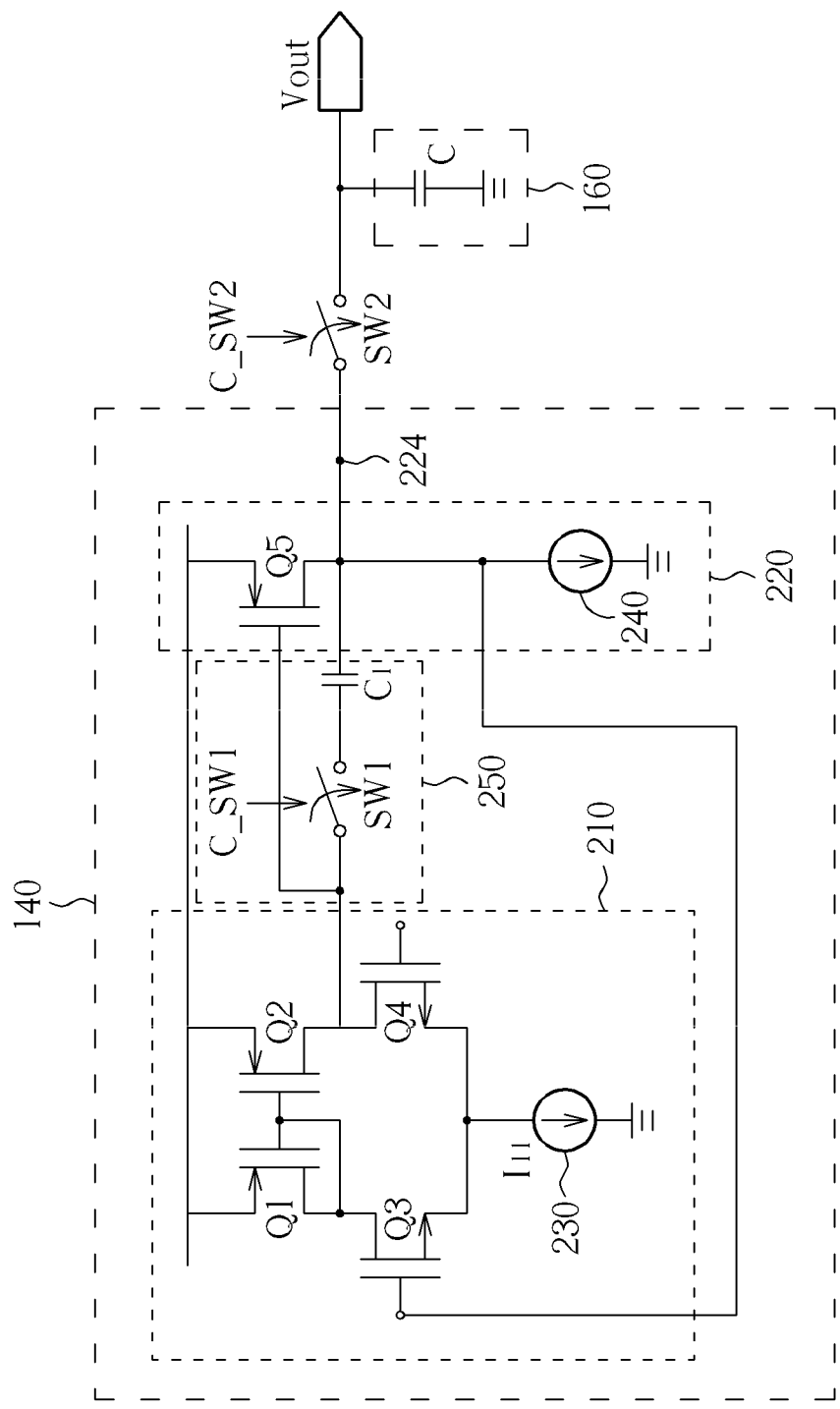
FIG. 2 is a circuit diagram of the operational amplifier shown in FIG. 1 according to an embodiment of the present invention.

FIG. 2 is a circuit diagram of the operational amplifier 140 shown in FIG. 1 according to an embodiment of the present invention. The operational amplifier 140 includes a first stage 210, a second stage 220, and a switching unit 250. The first stage 210 receives the analog input signal $S_2$ shown in FIG. 1. The second stage 220 having an output node 224 coupled to the output switch SW2. The output switch SW2 is further coupled to an output load 160. The switching unit 250 is coupled between the first stage 210 and the second stage 220. In addition, the first stage includes four transistors Q1-Q4 and a bias current source 230. The bias current source 230 is used for providing the bias current $I_{11}$ to the first stage 210. The connection manner of the four transistors Q1-Q4 and the bias current source 230 is shown in FIG. 2, and further description is omitted here for brevity. The second stage 220 includes a fifth transistor Q5 and a current source 240, wherein the current source 240 is coupled to the fifth transistor Q5. The switching unit 250 includes a capacitive component $C_1$ and a first switch SW1 coupled to the capacitive component $C_1$ in series. The first switch SW1 is turned off by a first switch control signal C_SW1 when the output switch SW2 is turned on by an output switch control signal C_SW2. The first switch SW1 is turned on by the first switch control signal C_SW1 when the output switch SW2 is turned off by the output control signal C_SW2.

The embodiment above is presented merely for describing features of the present invention, and should not be considered to be limitations of the scope of the present invention. Certainly, people skilled in the art will readily appreciate that other designs of implementing the operational amplifier 140 are feasible.

When the output switch SW2 is turned on by the output control signal C_SW2, the operational amplifier 140 starts to drive the output load 160. When the output switch SW2 is turned off by the output control signal C_SW2, the operational amplifier 140 stops driving the output load 160. At this time, the operational amplifier 140 is in a high-impedance state. In order to solve the limited slew-rate issue and the instability issue of the operational amplifier 140 without increasing the bias current $I_{11}$, a mechanism for controlling the operational amplifier 140 is disclosed in the present invention. That is: turning off the first switch SW1 when driving the output load 160 and turning on the first switch SW1 when the operational amplifier 140 is in a high-impedance state.

Please note that, the first switch SW1 and output switch SW2 can be implemented by a metal oxide semiconductor field-effect transistor (MOSFET), but can also be other types of switches. In addition, the display can be an LCD device, but is not limited to this in the present invention.

Please note that again, in this embodiment, the first switch SW1 is coupled between the first stage 210 and the capacitive component $C_1$, and the capacitive component $C_1$ is coupled between the first switch SW1 and the second stage 220, but the present invention is not limited to this only. In other embodiments, the capacitive component $C_1$ can be coupled between the first stage 210 and the first switch SW1, and the first switch SW1 can be coupled between the capacitive component $C_1$ and the second stage 220, which should also belong to the scope of the present invention. In other words, the positions of the first switch SW1 and the capacitive component $C_1$ are exchanged.

Figure 3:
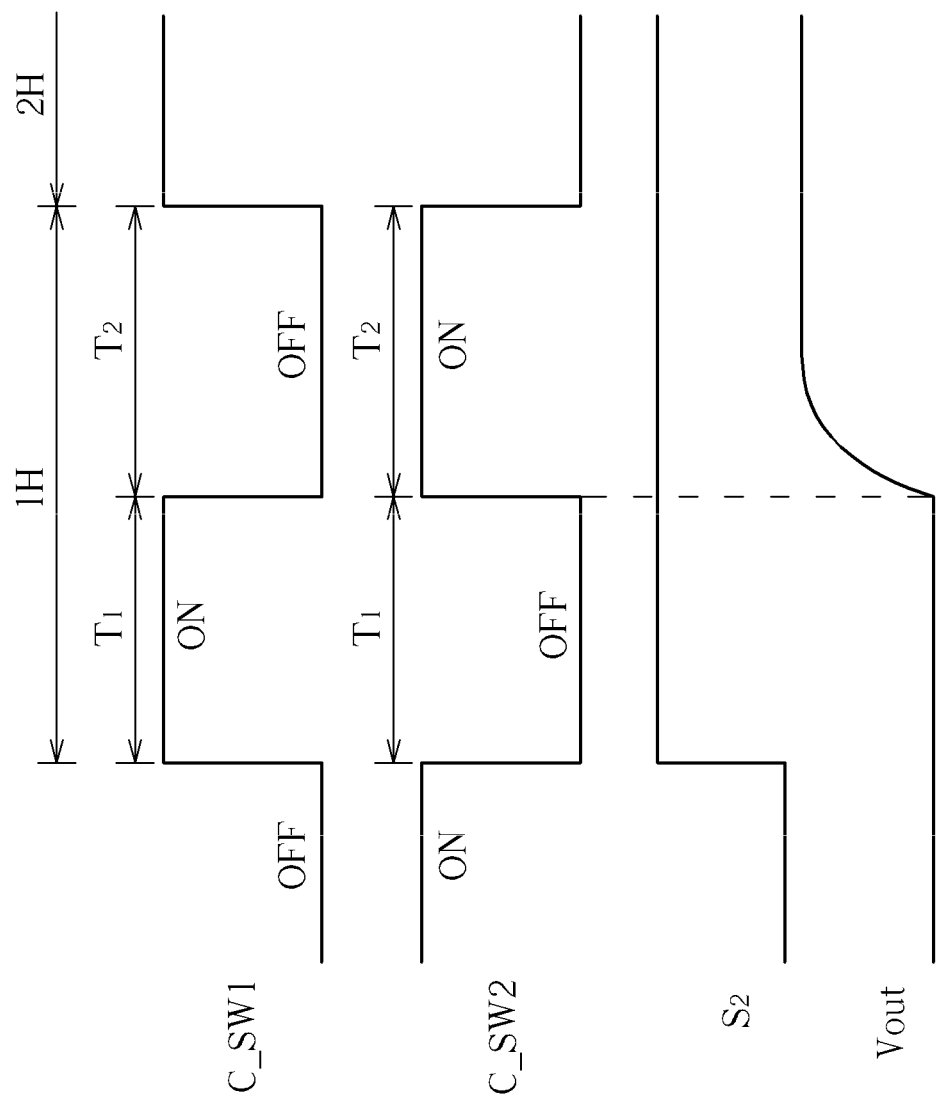
FIG. 3 is a diagram showing the waveforms of the first switch control signal, the output switch control signal, the analog input signal, and the output signal of the source driver 100 shown in FIG. 1 according to a first embodiment of the present invention.

FIG. 3 is a diagram showing the waveforms of the first switch control signal C_SW1, the output switch control signal C_SW2, the analog input signal $S_2$, and the output signal Vout of the source driver 100 shown in FIG. 1 according to a first embodiment of the present invention. The source driver 100 drives a horizontal line of the display during a first line period 1H. As shown in FIG. 3, during a period $T_1$ in beginning of the first line period 1H, the operational amplifier 140 receives a new analog input signal S2, the output switch SW2 is turned off by the output switch control signal C_SW2, and the first switch SW1 is turned on by the first switch control signal C_SW1. At this time, the operational amplifier 140 stops driving the output load 160, and still maintains stable due to the capacitive component $C_1$ been connected between the first stage 210 and the second stage 220.

During a period $T_2$, the output switch SW2 is turned on by the output switch control signal C_SW2 and the first switch SW1 is turned off by the first switch control signal C_SW1. At this time, the operational amplifier 140 starts to drive the output load 160, and the slew-rate of the operational amplifier 140 will not be restricted by $I_{11}/C_1$ due to the first switch SW1 being turned off to disconnect the capacitive component $C_1$ during the period $T_2$. In other words, the first switch SW1 is turned off while the analog input signal $S_2$ is in transition and is turned on while the analog input signal $S_2$ is steady.

Thus, the abovementioned limited slew-rate issue and the instability issue of the operational amplifier 140 can be solved. Be note that, in this embodiment, the first switch control signal C_SW1 is viewed as an inverted signal of the output switch control signal C_SW2.

Figure 4:
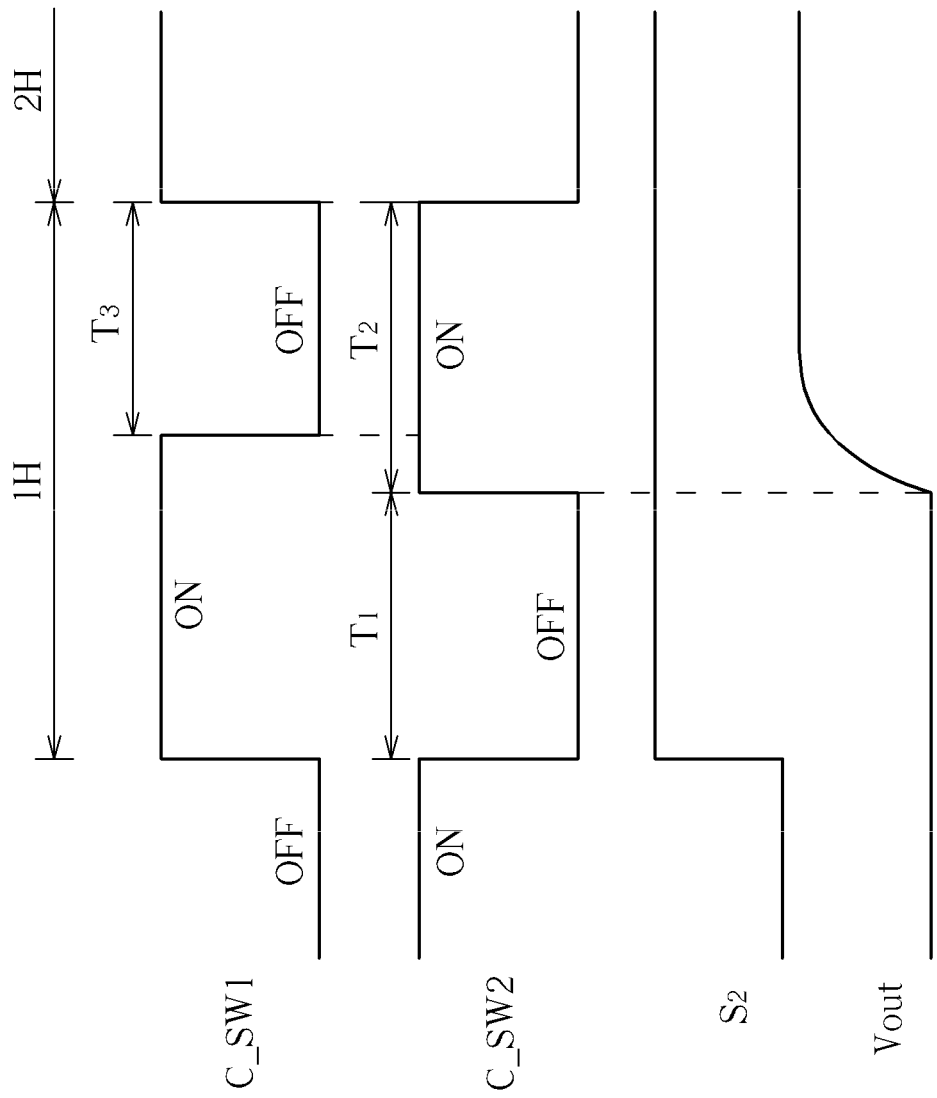
FIG. 4 is a diagram showing the waveforms of the first switch control signal, the output switch control signal, the analog input signal, and the output signal of the source driver 100 shown in FIG. 1 according to a second embodiment of the present invention.

FIG. 4 is a diagram showing the waveforms of the first switch control signal C_SW1, the output switch control signal C_SW2, the analog input signal $S_2$, and the output signal Vout of the source driver 100 shown in FIG. 1 according to a second embodiment of the present invention. The waveforms in FIG. 4 are similar to those in FIG. 3, and the difference between them is that the first switch SW1 is turned off during a period $T_3$, which is smaller than the period $T_2$. In other words, there is a delay time ($T_2$–$T_3$) that exists between the period $T_2$ and the period $T_3$. Please note that, in this embodiment, a turn-off period of the first switch SW1 is smaller than a turn-on period of the output switch SW2 (i.e., $T_3<T_2$).

Figure 5:
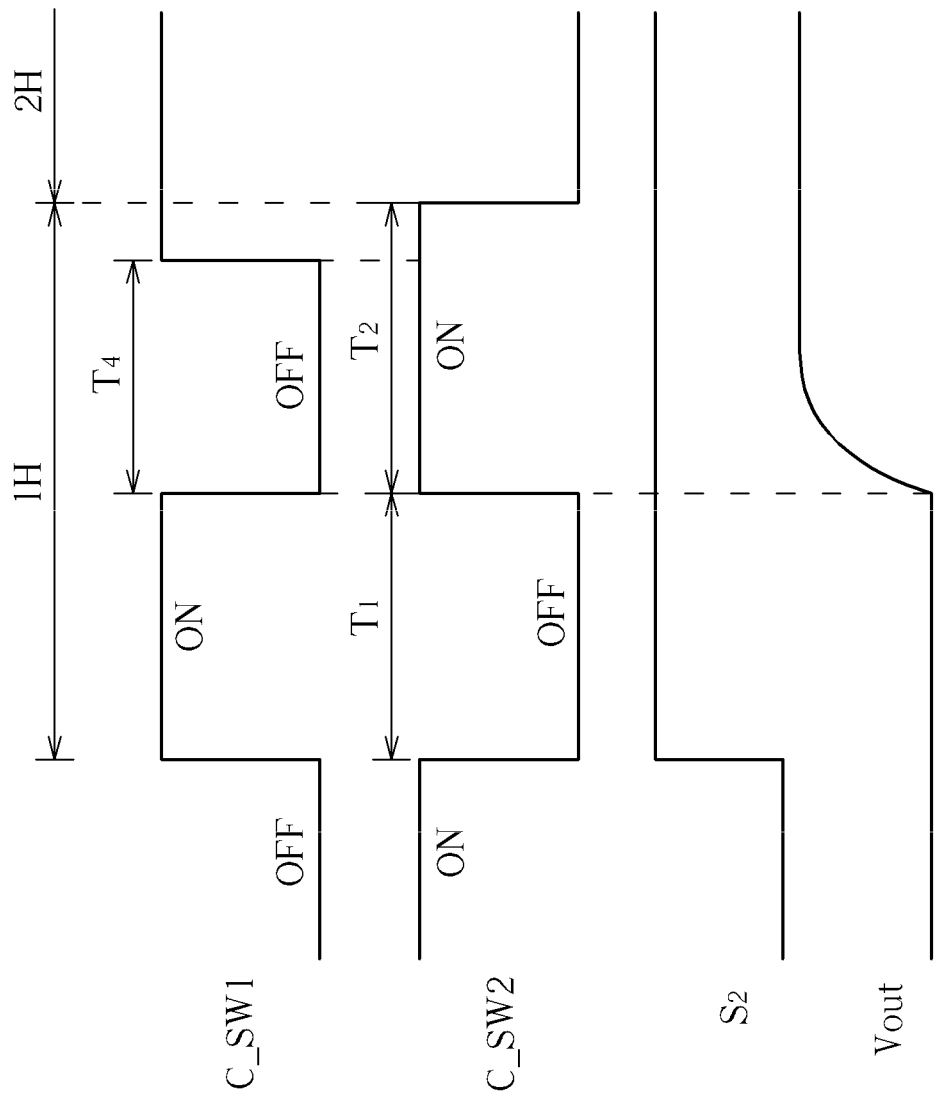
FIG. 5 is a diagram showing the waveforms of the first switch control signal, the output switch control signal, the analog input signal, and the output signal of the source driver 100 shown in FIG. 1 according to a third embodiment of the present invention.

FIG. 5 is a diagram showing the waveforms of the first switch control signal C_SW1, the output switch control signal C_SW2, the analog input signal $S_2$, and the output signal Vout of the source driver 100 shown in FIG. 1 according to a third embodiment of the present invention. The waveforms in FIG. 5 are similar to those in FIG. 3, and the difference between them is that the first switch SW1 is turned off during a period $T_4$, which is smaller than the period $T_2$. In other words, the first switch SW1 is turned on before the output switch SW2 is turned off. Please note that, in this embodiment, a turn-off period of the first switch SW1 is smaller than a turn-on period of the output switch SW2 (i.e., $T_4<T_2$).

Of course, the abovementioned embodiments are merely examples for illustrating features of the present invention and should not be seen as limitations of the present invention. Those skilled in the art should appreciate that various modifications of the periods $T_1$, $T_2$, $T_3$ and $T_4$ may be made.

Figure 6:
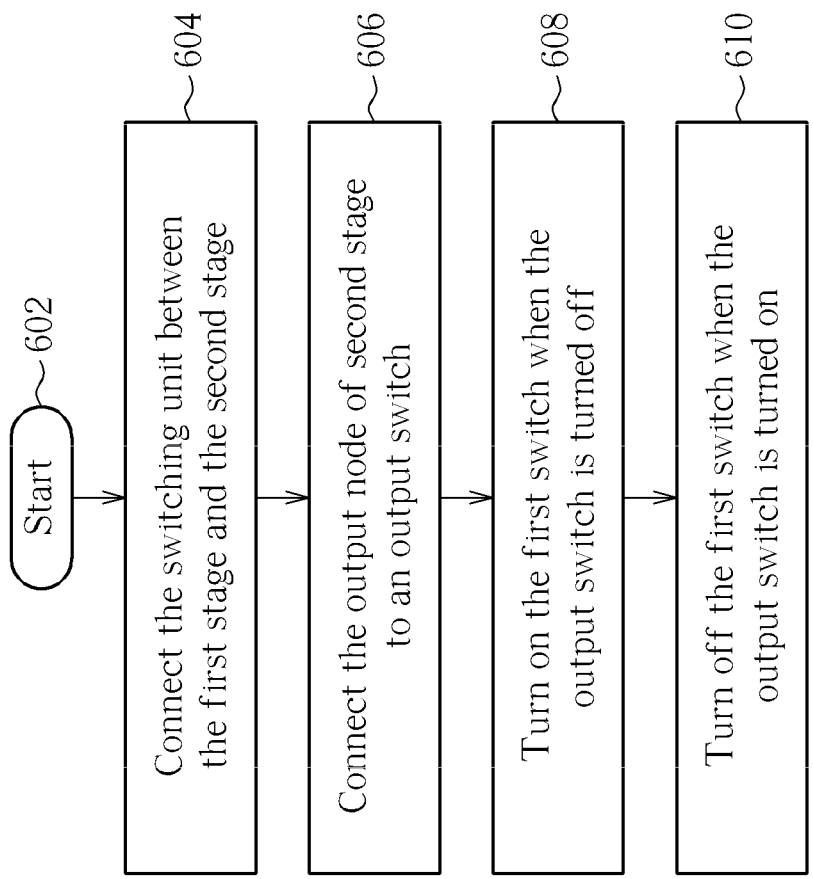
FIG. 6 is a flowchart illustrating a method for controlling an operational amplifier according to an embodiment of the present invention.

Please refer to FIG. 6. FIG. 6 is a flowchart illustrating a method for controlling an operational amplifier according to an embodiment of the present invention. Please note that the following steps are not limited to be performed according to the exact sequence shown in FIG. 6 if a roughly identical result can be obtained. The method includes, but is not limited to, the following steps:

Step 602: Start.

Step 604: Connect the switching unit between the first stage and the second stage.

Step 606: Connect the output node of the second stage to an output switch.

Step 608: Turn on the first switch when the output switch is turned off.

Step 610: Turn off the first switch when the output switch is turned on.

In the following description, the components shown in FIG. 2 are collocated with the steps shown in FIG. 6 together with the waveforms shown in FIG. 3 for further detailed descriptions of operating manners. In Step 608, the first switch SW1 is turned on by the first switch control signal C_SW1 when the operational amplifier 140 is in a high-impedance state during the period $T_1$. At this time, the output switch SW2 is turned off by the output switch control signal C_SW2. Therefore, the capacitive component $C_1$ is connected to maintain the close loop stability of the operational amplifier 140 when the second switch SW2 is turned off to disconnect the output load 160 during the period $T_1$. In step 610, the first switch SW1 is turned off by the first switch control signal C_SW1 when driving the output load 160 during the period $T_2$. At this time, the output switch SW2 is turned on by the output switch control signal C_SW2. Therefore, the slew-rate of the operational amplifier 140 will not be restricted by $I_{11}/C_1$ due to the first switch SW1 being turned off to disconnect the capacitive component $C_1$ during the period $T_2$.

Note that, the method shown in FIG. 6 is just a practicable embodiment, not limiting conditions of the present invention. And, the order of the steps merely represents a preferred embodiment of the method of the present invention. In other words, the illustrated order of steps can be changed based on the conditions, and is not limited to the above-mentioned order.

The abovementioned embodiments are presented merely for describing features of the present invention, and in no way should be considered to be limitations of the scope of the present invention. In summary, the present invention provides an operational amplifier of a source driver and a related source driver and method. By controlling the first switch SW1 to determine the timing of connecting and disconnecting the capacitive component $C_1$, the abovementioned limited slew-rate issue and the instability issue of the operational amplifier 140 can be solved without increasing the bias current $I_{11}$. When driving the output load 160 during the period $T_2$ (i.e., the output switch SW2 is turned on), the first switch SW1 is turned off to disconnect the capacitive component $C_1$ for improving the slew-rate of the operational amplifier 140. When the operational amplifier 140 is in a high-impedance state (i.e., the output switch SW2 is turned off), the first switch SW1 is turned on to connect the capacitive component $C_1$ for maintaining the close loop stability of the operational amplifier 140. Moreover, only one MOSFET (i.e., the first switch SW1) of the cost is increased to achieve the abovementioned advantages, which is economical on the considerations of the cost.

Those skilled in the art will readily observe that numerous modifications and alterations of the device and method may be made while retaining the teachings of the invention.

What is claimed is:

1. An operational amplifier, comprising:
    a first stage, for receiving an analog input signal;
    a second stage, having an output node coupled to an output switch; and
    a switching unit, coupled between the first stage and the second stage, the switching unit comprising:
        a capacitive component; and
        a first switch coupled to the capacitive component in series;
    wherein the first switch is turned off when the output switch is turned on; and
    during a whole line period that a line of a display is driven, the first switch has a turn-on period and a turn-off period, the output switch has a turn-on period and a turn-off period, and the turn-off period of the first switch is shorter than the turn-on period of the output switch.

2. The operational amplifier of claim 1, wherein the first switch is turned off while the analog input signal is in transition.

3. The operational amplifier of claim 2, wherein the first switch is turned on while the analog input signal is steady.

4. The operational amplifier of claim 1, wherein the first switch is turned on when the output switch is turned off.

5. The operational amplifier of claim 1, wherein:
    the first switch is coupled between the first stage and the capacitive component; and
    the capacitive component is coupled between the first switch and the second stage.

6. The operational amplifier of claim 1, wherein:
    the capacitive component is coupled between the first stage and the first switch; and
    the first switch is coupled between the capacitive component and the second stage.

7. The operational amplifier of claim 1, wherein the first switch and the output switch are each a metal oxide semiconductor field-effect transistor (MOSFET).

8. The operational amplifier of claim 1, wherein the first stage comprises:
    a first transistor;
    a second transistor, having a first end coupled to a first end of the first transistor, a control end coupled to a control end of the first transistor, and a second end coupled to a first end of the switching unit;
    a third transistor, having a first end coupled to a second end of the first transistor and the control ends of the first transistor and the second transistor;
    a fourth transistor, having a first end coupled to the second end of the second transistor and the first end of the switching unit; and
    a first current source, coupled to a second end of the third transistor and the second end of the fourth transistor.

9. The operational amplifier of claim 8, wherein the second stage comprises:
    a fifth transistor, having a first end coupled to the first ends of the first transistor and the second transistor, a control end coupled to the second end of the second transistor and the first end of the switching unit, and a second end coupled to a second end of the switching unit; and
    a second current source, coupled to the second end of the fifth transistor, the second end of the switching unit, and a control end of the third transistor.

10. A source driver of a display, comprising:
a digital-to-analog converter, for converting a digital input signal into an analog input signal;
an output switch; and
an operational amplifier, coupled to the digital-to-analog converter, for driving at least a data line of the display according to the analog input signal via the output switch, the operational amplifier comprising:
a first stage, for receiving the analog input signal;
a second stage, having an output node coupled to the output switch; and
a switching unit, coupled between the first stage and the second stage, the switching unit comprising:
a capacitive component; and
a first switch, coupled to the capacitive component in series;
wherein the first switch is turned off when the output switch is turned on; and
during a whole line period that a line of the display is driven, the first switch has a turn-on period and a turn-off period, the output switch has a turn-on period and a turn-off period, and the turn-off period of the first switch is shorter than the turn-on period of the output switch.

11. The operational amplifier of claim 10, wherein the first switch is turned off while the analog input signal is in transition.

12. The operational amplifier of claim 11, wherein the first switch is turned on while the analog input signal is steady.

13. The operational amplifier of claim 10, wherein the first switch is turned on when the output switch is turned off.

14. A method for controlling an operational amplifier, the operational amplifier comprising a first stage for receiving an analog input signal, a second stage having an output node, and a switching unit having a capacitive component and a first switch coupled to the capacitive component in series, the method comprising:
connecting the switching unit between the first stage and the second stage;
connecting the output node of the second stage to an output switch; and
turning off the first switch when the output switch is turned on, where during a whole line period that a line of the display is driven, the first switch has a turn-on period and a turn-off period, the output switch has a turn-on period and a turn-off period, and the turn-off period of the first switch is shorter than the turn-on period of the output switch.

15. The method of claim 14, further comprising:
turning off the first switch while the analog input signal is in transition; and
turning on the first switch while the analog input signal is steady.

16. The method of claim 14, further comprising:
turning on the first switch when the output switch is turned off.

17. An operational amplifier, comprising:
a first stage, for receiving an analog input signal;
a second stage, having an output node coupled to an output switch; and
a switching unit, coupled between the first stage and the second stage, the switching unit comprising:
a capacitive component; and
a first switch, where the capacitive component is coupled between the first stage and the first switch, and the first switch is coupled between the capacitive component and the second stage, the first switch is selectively coupling the capacitive component to the output node of the second stage, and the capacitive component is connected to the output node of the second stage only when the first switch is switched on;
wherein the first switch is turned off when the output switch is turned on.

* * * * *